(12) United States Patent
Kim et al.

(10) Patent No.: US 7,186,655 B2
(45) Date of Patent: Mar. 6, 2007

(54) METHOD FOR MANUFACTURING SEMICONDUCTOR DEVICE

(75) Inventors: Chang Gyu Kim, Seongnam-si (KR); Chi Hong Kim, Ulsangwangyeok-si (KR); Hi Soon Kang, Cheongju-si (KR); Tae Won Lee, Cheongju-si (KR); Kwang Suk Park, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 56 days.

(21) Appl. No.: 11/006,187

(22) Filed: Dec. 7, 2004

(65) Prior Publication Data

US 2005/0196965 A1    Sep. 8, 2005

(30) Foreign Application Priority Data

Mar. 8, 2004   (KR) .................. 10-2004-0015467

(51) Int. Cl.
*H01L 21/302* (2006.01)
(52) U.S. Cl. .................. 438/693; 438/692; 438/694; 438/697; 257/E21.002
(58) Field of Classification Search ............ 438/692, 438/693, 694, 697
See application file for complete search history.

(56) References Cited

U.S. PATENT DOCUMENTS 6,540,935 B2 *  4/2003  Lee et al. .............. 252/79.1
6,997,788 B2 *  2/2006  Wu et al. ................. 451/57
2002/0168857 A1 * 11/2002  Kobayashi ............... 438/689
2005/0142988 A1 *  6/2005  Kim et al. ................ 451/41

FOREIGN PATENT DOCUMENTS

| JP | 2000-068371     |   | 3/2000  |
|----|-----------------|---|---------|
| JP | 2002-0020796    |   | 3/2002  |
| JP | 1020020030138   | A | 4/2002  |
| KR | 1020020077636   | A | 10/2002 |

OTHER PUBLICATIONS

Notice of Rejection in corresponding Korean Appl. No. 10-2004-0015467 dated Sep. 28, 2005.

\* cited by examiner

*Primary Examiner*—Zandra V. Smith
*Assistant Examiner*—Christy Novacek
(74) *Attorney, Agent, or Firm*—Marshall, Gerstein & Borun LLP

(57) ABSTRACT

The disclosure relates to a method for manufacturing a semiconductor device by performing a planarization process including a first CMP process using a slurry including 0.05~0.5 wt % $CeO_2$ or $MnO_2$ as an abrasive and a second CMP process using a slurry including $SiO_2$ as the other abrasive regardless of order of the processes. The CMP process is performed using the first slurry having a high polishing speed in the middle of the wafer and the second slurry having a high polishing speed at the edge of the wafer, thereby decreasing the processing cost and securing the process margin to secure yield and reliability of devices

20 Claims, 4 Drawing Sheets

METHOD FOR MANUFACTURING SEMICONDUCTOR DEVICE

BACKGROUND OF THE DISCLOSURE

1. Technical Field

The disclosure relates to a method for manufacturing a semiconductor device, and more specifically, to a method for manufacturing a semiconductor device which includes a planarization process including a first and second Chemical Mechanical Polishing (CMP) processes using $CeO_2$ and $SiO_2$ slurries to improve uniformity of the CMP process, thereby securing yield and reliability of devices.

2. Description of the Related Art

As the degree of integration of semiconductor devices increases, planarization processes using CMP are generally performed.

The CMP process, which is necessarily performed to planarize contact plugs and insulating films of semiconductor devices, planarizes the surface of a wafer to be processed using frictional force of a slurry and a polishing pad. In the CMP process, consumable materials such as a backing film slurry, a diamond conditioner, and a retainer ring are used, and the slurry accounts for the greatest expense. Since scratches in a semiconductor device are generated by agglomeration phenomena of abrasives included in the slurry or by abrasives having large particles (greater than 0.1 μm), a slurry filter may be required to remove such scratches.

The CMP process causes dishing phenomena by pressure between the wafer surface to be processed and the polishing pad and by residual abrasive in the slurry. As a result, in order to reduce such phenomena, dummy patterns are properly designed and/or a method of increasing line speed and decreasing pressure of the CMP process is applied. Additionally, in order to obtain desired planarization in the CMP process, which causes the dishing phenomena, whole films might be formed thickly and then the CMP processing amount is increased, which results in high cost and low efficiency.

Furthermore, when polishing speed is increased and polishing pressure is decreased to improve degree of the planarization by the CMP process, non-uniformity in the wafer results, which adversely affects the subsequent contact etching process.

Meanwhile, a slurry mostly including silica ($SiO_2$) as the abrasive has been used in conventional CMP process applied to an insulating film or a landing plug contact. As a result, the polishing speed in edge portions of the wafer is high, so that the semiconductor device is damaged at the edge portions.

Therefore, a CMP method to solve the above-described problems and to improve uniformity of the CMP process has been required in a process for manufacturing a semiconductor device.

SUMMARY OF THE DISCLOSURE

The disclosure provides a method for manufacturing a semiconductor device, which improves uniformity of a CMP process, thereby securing high yield and reliability of the device.

There is provided a method for manufacturing a semiconductor device, including a CMP process which comprises:

(i) a first CMP process using a first CMP slurry including $CeO_2$ or $MnO_2$ as an abrasive; and (ii) a second CMP process using a second CMP slurry including $SiO_2$ as the other abrasive, where the first and second CMP processes can be carried out in either order.

DETAILED DESCRIPTION OF THE PREFERRED EMBODIMENTS

Figure 1A:
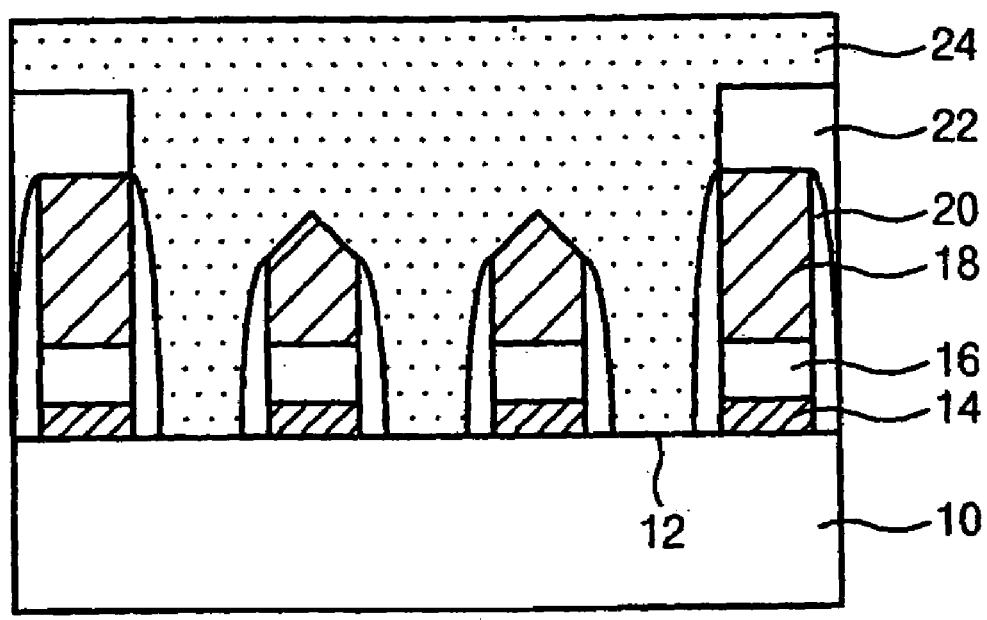
FIGS. 1a to 1c are cross-sectional diagrams illustrating a method for forming a contact plug of a semiconductor device.

In one embodiment of the disclosed method, the first CMP process using a first CMP slurry including 0.05~0.5 wt % $CeO_2$ or $MnO_2$ as an abrasive and the second CMP process using the second CMP slurry including $SiO_2$ as the other abrasive are performed regardless of order of the processes.

When the concentration of $CeO_2$ or $MnO_2$ included in the first CMP slurry is present in an amount of less than 0.05 wt %, the mechanical polishing effect is not accomplished. When the concentration of $CeO_2$ included in the first CMP slurry is more than 0.5 wt %, the planarization ability is degraded and micro-scratches are generated depending on an increase of concentration of polishing particles in the slurry. As a result, in order to maintain a proper polishing speed and to minimize micro-scratches, the slurry including 0.05~0.5 wt % $CeO_2$ is preferably used in the first CMP process. More preferably, the concentration of $CeO_2$ included in the first CMP slurry is 0.1 wt %.

Preferably, the concentration of $SiO_2$ included in the second CMP slurry ranges from 5 wt % to 25 wt %.

The first and second CMP processes may be performed regardless of order, and each of those processes use a common polishing pad or individual polishing pads.

Preferably, the CMP process is applicable in various processes such as an insulating film planarization process, an STI (shallow trench isolation) CMP process, a landing plug poly CMP process, a tungsten CMP process, an aluminum CMP process or a copper CMP process.

The slurry used in the STI CMP process and the landing plug poly CMP process includes any of anionic additive, cationic additive or nonionic additive which is present in an amount ranging from 0.005 wt % to 25 wt % based on total amount of the slurry.

Preferably, the anionic additive is selected from the group consisting of carboxylic acids or salts thereof, sulfuric acid esters or salts thereof, sulfonic acids or salts thereof, and phosphoric acid esters or salts thereof. The cationic additive is selected from the group consisting of primary amines or salts thereof, secondary amines or salts thereof, tertiary amines or salts thereof, and quaternary amines or salts thereof. The nonionic additive is preferably a polyethyleneglycol-type surfactant or polyhydroxy alcohol-type surfactant.

In addition, there is provided a method for manufacturing a semiconductor device, comprising the steps of:

(a) forming a stack pattern comprising a conductive material and a hard mask film on a semiconductor substrate;

(b) depositing an oxide film on entire surface of the resultant structure to form an insulating film;

(c) selectively etching the insulating film to form a contact hole, so that the stack pattern is positioned in the contact hole;

(d) forming a conductive material on the entire surface of the resultant structure to fill the contact hole;

(e) removing the insulating film and the conductive material until the hard mask film is exposed using a first CMP slurry including 0.05~0.5 wt % $CeO_2$ or $MnO_2$ as an abrasive; and (f) removing the hard mask film, the conductive material and the insulating film using a second CMP slurry including 5 wt % to 25 wt % $SiO_2$ (as the other abrasive) until the conductive material is separated to form a contact plug.

Figure 1B:
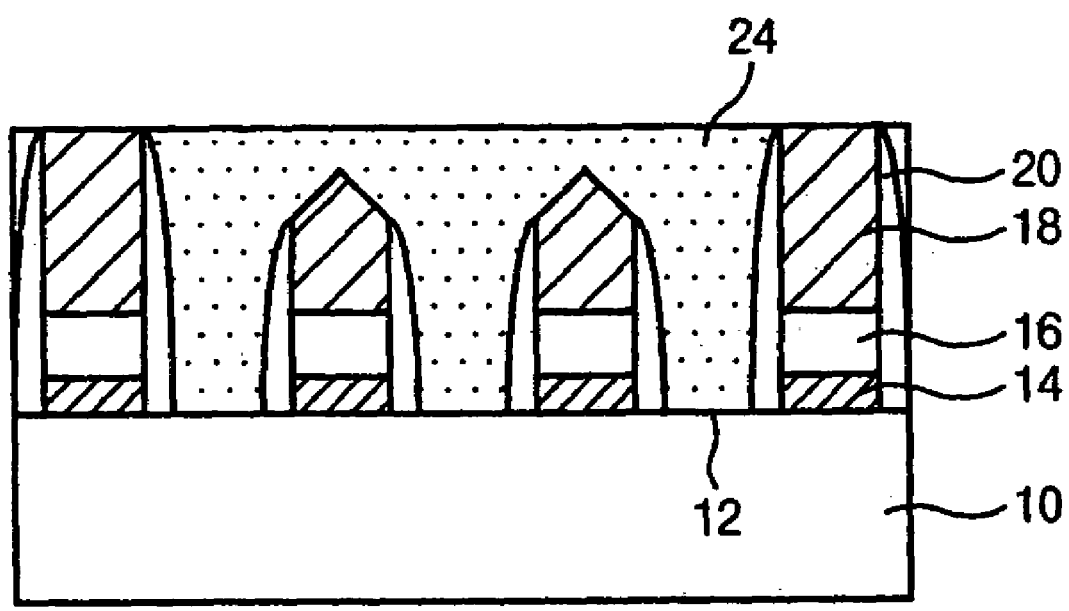
Figure 1C:
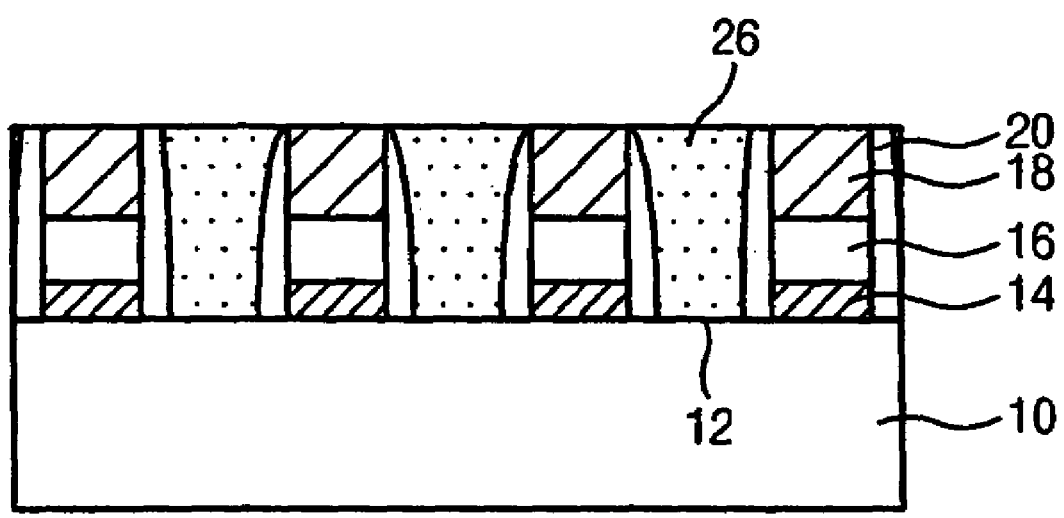

The methods will be described in detail with reference to the accompanying drawings. FIGS. 1a to 1c are cross-sectional diagrams illustrating a method for forming a contact plug of a semiconductor device.

A contact plug, which is more specifically a landing plug contact of a semiconductor device, is formed in an embodiment of the disclosed method.

First, a insulating film and a conductive material are polished by a first CMP process until a hard mask film is exposed using a first CMP slurry including 0.05~0.5 wt % $CeO_2$ as an abrasive, and then the hard mask film, a conductive material and the insulating film are polished in order by a second CMP process until the conductive material is separated using a second CMP slurry including $SiO_2$ as the other abrasive, thereby obtaining a contact plug.

Referring to FIG. 1a, a device separation process, various ion-introduction processes and a thermal treatment process are performed on a silicon wafer 10. Next, a stack pattern where a gate oxide film 12, a polysilicon film which as a conductive materials 14, 16 and SiN film as a hard mask film 18 are sequentially deposited is formed.

After an oxide film is deposited on the entire surface of the resultant structure, the resultant structure is blanket-etched to form a spacer 20 at a sidewall of the stack pattern.

Next, a BPSG (Boron Phosphorus Silicate Glass) oxide film is deposited on the entire surface of the resultant structure to form an insulating film 22. Then, the insulating film 22 is selectively etched to obtain a contact hole (not shown) where the stack pattern is positioned.

Thereafter, a polysilicon film 24 as a conductive material is formed on the entire surface of the resultant structure to fill the contact hole.

Referring to FIG. 1b, the insulating film 22 and the conductive material 24 are polished until the hard mask film 18 is exposed using the first CMP slurry including 0.05~0.5 wt % $CeO_2$ as the abrasive.

Since the first CMP slurry including the low-concentration $CeO_2$ as the abrasive has higher polishing selectivity ratio of the SiN film as the hard mask film to the oxide film and the conductive material, compared to the second slurry including $SiO_2$ as the other abrasive, the process using the hard mask film 18 as a polishing barrier film may be easily regulated, so that the planarization degree is excellent, the thickness of films formed before the CMP process is reduced and the amount of CMP process is decreased, thereby improving uniformity of the semiconductor device. Here, the polishing selectivity ratio of the SiN film as the hard mask film 18 to the insulating film 22 and the conductive material 24 is 5:1 in case of the first slurry while 3:1 in case of the second slurry.

Additionally, the polishing selectivity ratio of slurry of the disclosed method may be regulated by adding any of the above-described anionic additive, the cationic additive or the non-ionic additive.

Referring to FIG. 1c, the hard mask film 18, the spacer 20, the conductive material 24 and the insulating film 22 are polished until the conductive material 24 is separated using the second CMP slurry including from 5 wt % to 25 wt % $SiO_2$, thereby obtaining a contact plug 26.

As described above, the first slurry including from 0.05 wt % to 0.5 wt %, preferably 0.1 wt % $CeO_2$ as the abrasive is used as a means to reduce micro-scratches, improve the planarization, decrease processing cost and improve yield and productivity. The first slurry increases the polishing speed in the middle of the wafer while the second slurry including $SiO_2$ as the other abrasive increases the polishing speed in the edge of the wafer. As a result, the CPM processing amount may be maintained to become complementary and uniform, and stability of the CMP process for the contact plug can be secured because the first slurry has the polishing selectivity ratio of the hard mask film to the oxide film and the conductive material higher than that of the second slurry. Even when the order of the first CMP process and the second CMP process is changed depending on characteristics of semiconductor devices, the similar effect can be obtained.

In addition, the above-described CMP process is used in a variety of processes such as insulating film planarization process, STI CMP process, landing plug poly CMP process, tungsten CMP process, aluminum CMP process or copper CMP process, thereby securing the stability of the CMP process.

Figure 2:
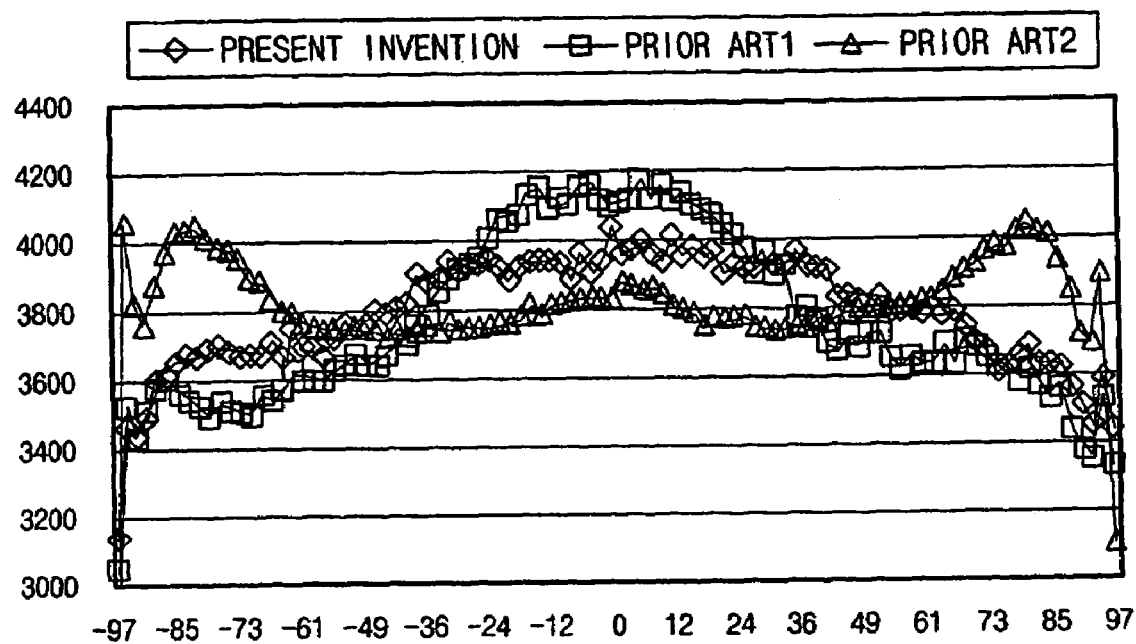
FIG. 2 is a graph illustrating polishing degree when a TEOS oxide film was polished using a disclosed CMP process.

FIG. 2 is a graph illustrating polishing degree when a TEOS oxide film is polished using a disclosed CMP process. Here, the axis X represents a measurement point (0; the middle of the wafer), and the axis Y represents the polishing degree. The CMP process is performed under polishing conditions such as at a platen ranging from 90 rpm to 10 rpm, at a head speed ranging from 80 rpm to 110 rpm and at a polishing pressure ranging from 3 psi to 6 psi.

In an embodiment, the triangle (Δ) according to the prior art represents the TEOS oxide film polished using a slurry including 12 wt % $SiO_2$ as an abrasive, and the rectangle (□) according to the prior art represents the TEOS oxide film polished using a slurry including 0.1 wt % $CeO_2$ as the abrasive. The highest polishing amount is shown at 85 mm and the outermost edge portion of the wafer when the slurry including $SiO_2$ as the abrasive is used, and in the middle of the wafer in case where the slurry including $CeO_2$ as the abrasive is used.

As shown in the foregoing results, non-uniformity of the polishing amount may reduce margin of the subsequent etching process and damage the lower patterns, thereby decreasing life time of disks and pads and degrading yield and reliability of devices. Therefore, the CMP process requires to be under a maintenance.

Meanwhile, the diamond (◇) according to an embodiment of the method represents when the TEOS oxide film is polished by performing a first CMP process using a slurry including 12 wt % $SiO_2$ as the abrasive which shows the rapid polishing speed at the edge of the wafer, and a second CMP process using a slurry including 0.1 wt % $CeO_2$ as the other abrasive which shows the rapid polishing speed in the middle of the wafer. Herein, the polishing amount of 50:50 is performed, but the first CMP amount and the second CMP amount may be properly regulated to obtain a desirable polishing profile for a semiconductor device.

The disclosed CMP process is preferably performed using the first slurry having a high polishing speed in the middle of the wafer and the second slurry having a high polishing speed at the edge of the wafer, thereby decreasing the processing cost and securing the process margin to secure yield and reliability of devices.

Additionally, non-uniformity and instability of the CMP process can be overcome, so that lifetime of materials which are necessarily required in the CMP process such as a pad, a backing film, a diamond conditioner and a retainer ring can be extended.

What is claimed is:

1. A method for manufacturing a semiconductor device, comprising a CMP (Chemical Mechanical Polishing) process which comprises:
   (a) forming a stack pattern comprising a first conductive material and a hard mask layer on a semiconductor substrate;
   (b) depositing an oxide film on entire surface of the resultant structure to form an insulating film;
   (c) selectively etching the insulating film to form a contact hole, so that the stack pattern is positioned in the contact hole;
   (d) forming a second conductive material on the entire surface of the resultant structure to fill the contact hole;
   (e) removing the insulating film and the second conductive material until the hard mask film is exposed using a first CMP slurry including about 5 wt % to about 25 wt % $SiO_2$ as an abrasive; and
   (f) removing the hard mask film, the second conductive material and the insulating film using a second CMP slurry including about 0.05 wt % to about 0.5 wt % $CeO_2$ until the conductive material is separated to form a contact plug.

2. The method according to claim 1, wherein the concentration of $CeO_2$ in the second CMP slurry is 0.1 wt %.

3. The method according to claim 1, comprising using a common polishing pad in each of steps (e) and (f).

4. The method according to claim 1, comprising using an individual polishing pad in each of steps (e) and (f).

5. The method according to claim 1, wherein the second conductive material is polysilicon.

6. The method according to claim 1, wherein the first CMP slurry, the second CMP slurry or a combination thereof further comprises at least one selected from the group consisting of anionic additives, cationic additives and nonionic additives.

7. The method according to claim 6, wherein the anionic additive is selected from the group consisting of carboxyl acids or salts thereof, sulfuric acid esters or salts thereof, sulfonic acids or salts thereof, and phosphoric acid esters or salts thereof.

8. The method according to claim 6, wherein the cationic additive is selected from the group consisting of primary amines or salts thereof, secondary amines or salts thereof, tertiary amines or salts thereof, and quaternary amines or salts thereof.

9. The method according to claim 6, wherein the nonionic additive is a polyethyleneglycol-type surfactant or a polyhydroxy alcohol-type surfactant.

10. The method according to claim 6, wherein the additive is present in an amount ranging from 0.005 wt % to 25 wt % based on the total amount of the slurry.

11. A method for manufacturing a semiconductor device, comprising the steps of:
    (a) forming a stack pattern comprising a first conductive material and a hard mask layer on a semiconductor substrate;
    (b) depositing an oxide film on entire surface of the resultant structure to form an insulating film;
    (c) selectively etching the insulating film to form a contact hole, so that the stack pattern is positioned in the contact hole;
    (d) forming a second conductive material on the entire surface of the resultant structure to fill the contact hole;
    (e) removing the insulating film and the second conductive material until the hard mask film is exposed using a first CMP slurry including about 5 wt % to about 25 wt % $SiO_2$ as an abrasive; and
    (f) removing the hard mask film, the conductive material and the insulating film using a second CMP slurry including about 0.05 wt % to about 0.5 wt % $MnO_2$ until the conductive material is separated to form a contact plug.

12. The method according to claim 11, wherein the concentration of $MnO_2$ in the second CMP slurry is 0.1 wt %.

13. The method according to claim 11, comprising using a common polishing pad in each of steps (e) and (f).

14. The method according to claim 11, comprising using individual polishing pads in each of steps (e) and (f).

15. The method according to claim 11, wherein the second conductive material is polysilicon.

16. The method according to claim 11, wherein the first CMP slurry, the second CMP slurry or a combination thereof further comprises at least one selected from the group consisting of anionic additives, cationic additives and nonionic additives.

17. The method according to claim 16, wherein the anionic additive is selected from the group consisting of carboxyl acids and salts thereof, sulfuric acid esters and salts thereof, sulfonic acids and salts thereof, and phosphoric acid esters and salts thereof.

18. The method according to claim 16, wherein the cationic additive is selected from the group consisting of primary amines and salts thereof, secondary amines and salts thereof, tertiary amines and salts thereof, and quaternary amines and salts thereof.

19. The method according to claim 16, wherein the nonionic additive is a polyethyleneglycol-type surfactant or a polyhydroxy alcohol-type surfactant.

20. The method according to claim 16, wherein the additive is present in an amount ranging from 0.005 wt % to 25 wt % based on the total amount of the slurry.

* * * * *

UNITED STATES PATENT AND TRADEMARK OFFICE
CERTIFICATE OF CORRECTION

PATENT NO.         : 7,186,655 B2                                    Page 1 of 1
APPLICATION NO. : 11/006187
DATED              : March 6, 2007
INVENTOR(S)        : Chang G. Kim et al.

It is certified that error appears in the above-identified patent and that said Letters Patent is hereby corrected as shown below:

On the Title Page:

At Item (57), line 4, "CeO2" should be -- $CeO_2$ --.

At Item (57), line 4, "MnO2" should be -- $MnO_2$ --.

At Item (57), line 5, "SiO2" should be -- $SiO_2$ --.

In the Claims:

At Column 5, line 27, "$CeO_2$" should be -- $CeO_2$ --.

Signed and Sealed this

Twenty-fifth Day of September, 2007

JON W. DUDAS
*Director of the United States Patent and Trademark Office*